United States Patent [19]

Botker

[11] Patent Number: 5,764,105
[45] Date of Patent: Jun. 9, 1998

[54] PUSH-PULL OUTPUT CIRCUIT METHOD

[75] Inventor: Thomas L. Botker, Tucson, Ariz.

[73] Assignee: Burr-Brown Corporation, Tucson, Ariz.

[21] Appl. No.: 754,883

[22] Filed: Nov. 22, 1996

[51] Int. Cl.$^6$ ............................................. H03F 3/26
[52] U.S. Cl. .................................. 330/262; 330/273
[58] Field of Search .............................. 330/262, 273, 330/274, 288, 296

[56] References Cited

U.S. PATENT DOCUMENTS

| | | | |
|---|---|---|---|
| 4,403,200 | 9/1983 | Davis | 330/294 |
| 4,513,251 | 4/1985 | Vyne | 330/292 |
| 4,538,116 | 8/1985 | Vyne | 330/271 |
| 4,553,106 | 11/1985 | Vyne | 330/272 |
| 4,709,216 | 11/1987 | Davis | 330/252 |
| 4,922,208 | 5/1990 | Susak et al. | 330/273 X |
| 5,021,746 | 6/1991 | Huynh | 330/262 |

Primary Examiner—Steven J. Mottola
Attorney, Agent, or Firm—Cahill, Sutton & Thomas P.L.C.

[57] ABSTRACT

A push-pull output circuit includes first and second transistors each having a base coupled to a first conductor coupled to respond to an input signal. An emitter of the first transistor is coupled by a first resistor to a first supply voltage conductor and an emitter of the second transistor is coupled to the first supply voltage conductor. A pull-up circuit is coupled to the collectors of the first and second transistors. An output conductor is coupled to the collector of the second transistor. A third transistor having an emitter connected to the collector of the first transistor and a base and collector of a fourth transistor. A bias current source is coupled to the base of the third and fourth transistors to maintain the collector of the first transistor and the output conductor at substantially equal voltages.

13 Claims, 2 Drawing Sheets

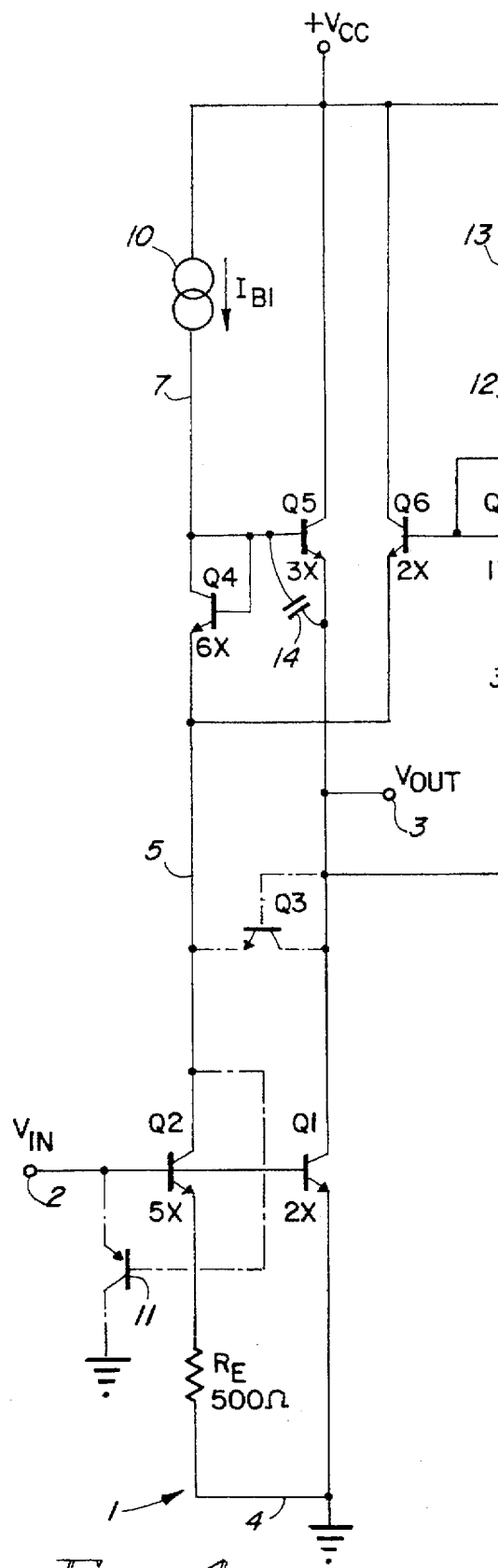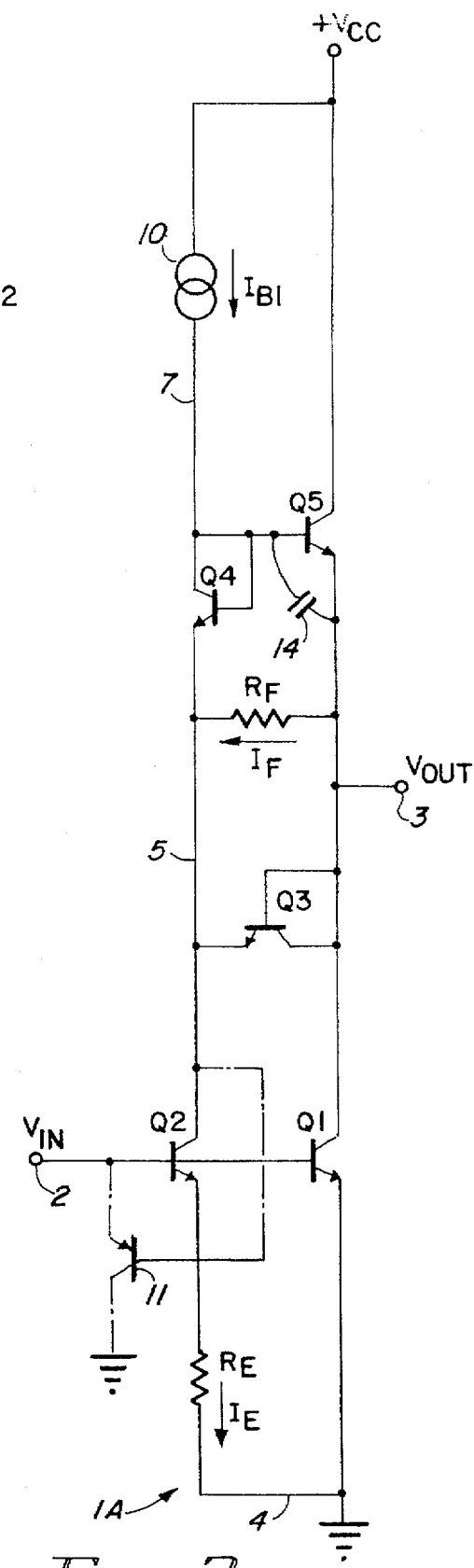
Fig. 1
Fig. 2 (PRIOR ART)

PUSH-PULL OUTPUT CIRCUIT METHOD

BACKGROUND OF THE INVENTION

The invention relates to push-pull output circuits, and particularly to a fast, stable, all-NPN push-pull output circuit which can produce a minimum output voltage level one $V_{CE(sat)}$ above a negative power supply conductor without requiring excessive drive current that loads a prior circuit stage having its output connected to the input of the push-pull output circuit.

The closest prior art to the present invention is believed to consist of the prior art circuit shown in FIG. 2 hereof and the similar output circuit of U.S. Pat. No. 4,403,200. In FIG. 2, prior art push-pull output circuit 1A includes pull-down transistors Q2 and Q1 having their respective bases connected to receive input signal $V_{IN}$. The emitter of NPN transistor Q1 is connected directly to ground. The emitter of transistor Q2 is connected by resistor $R_E$ to ground. The collectors of transistors Q1 and Q2 are connected to output conductor 3 and conductor 5, respectively. A diode-connected NPN transistor Q3 is connected between output conductor 3 and conductor 5 as show. A feedback resistor $R_F$ is also connected between conductors 3 and 5. Bias for transistor Q2 is supplied through a diode-connected NPN transistor Q4 having its emitter connected to conductor 5 and its collector and base connected to the base of NPN pull-up transistor Q5 and to a constant current source 10. The emitter of transistor Q5 is connected to output conductor 3. A large parasitic base-emitter capacitance 14 exists between the base and emitter of pull-up transistor Q5. In a typical junction-isolated integrated circuit structure, a parasitic PNP "substrate transistor" 11 is present as shown in dotted lines, with the N-type collector of transistor Q2 forming the base of parasitic transistor 11, the base of transistor Q2 forming the emitter of the parasitic transistor 11, and the P-type substrate forming the collector thereof. A similar parasitic transistor (not shown) is associated with transistor Q1 but ordinarily never turns on because transistor Q2 saturates first.

The basic operation of prior art output stage 1A is that if $V_{IN}$ is initially at a low level, transistors Q2 and Q1 are off, and the constant bias current $I_{B1}$ produced by current source 10 flows into the base of pull-up transistor Q5 to the extent necessary to enable transistor Q5 to supply the output current required by a load (not shown) connected to output conductor 3. The rest of $I_{B1}$ flows through diode-connected transistor Q4, transistor Q2, and resistor $R_E$.

If $V_{IN}$ rapidly rises to a high level, Q2 and Q1 turn on. All of $I_{B1}$ (except the negligible base current to transistor Q5) flows through diode-connected transistor Q4 into the collector of transistor Q2. As $V_{IN}$ rises, more current is drawn from the load connected to output conductor 3 through feedback resistor $R_F$, and as $V_{IN}$ rises further, Q3 is turned on, and that current also flows into the collector of transistor Q2. The emitter current of transistor Q2 flows through resistor $R_E$ to ground, producing a voltage drop across resistor $R_E$. Diode-connected transistor Q3 prevents conductor 5 from falling more than one $V_{BE}$ voltage drop below $V_{OUT}$. The voltage drops across resistors $R_F$ and $R_E$ cause transistor Q2 to saturate first, before transistor Q1. The parasitic base-emitter capacitance 14 of NPN pull-up transistor Q5 is charged to $V_{BE5}$ volts (the forward $V_{BE}$ voltage of Q5) when transistor Q5 is turned on and is sourcing current to a load connected to output conductor 3, that capacitance 14 becomes discharged by as much as $V_{BE3}$ (the forward $V_{BE}$ voltage of transistor Q3) when transistor Q2 pulls current from output conductor 3 through feedback resistor $R_F$ and transistor Q3 if it is turned on.

Furthermore, in a junction-isolated integrated circuit structure, parasitic PNP transistor 11 turns on if the sum of the voltage drops across resistor $R_E$ and the saturation voltage $V_{CE(sat)2}$ of transistor Q2 is less than the forward $V_{BE}$ voltage of parasitic transistor 11. That "robs" current from the prior circuit stage (not shown) which applies the input voltage $V_{IN}$ to input conductor 2. A typical low power circuit stage connected to drive prior art push-pull output circuit 1A can supply only about 30 microamperes. Unless such prior stage can supply a large current, e.g., 200 microamperes, such current "robbed" by parasitic PNP transistor 11 prevents Q1 from saturating. The output voltage $V_{OUT}$ is pulled from its initial high level to a level equal to $I_E \times R_E + I_F \times R_F + V_{CE(sat)2}$ if transistor Q3 is off and $I_E \times R_E \times V_{BE3} + V_{CE(sat)2}$ if transistor Q3 is on, where $V_{CE(sat)2}$ is the saturation voltage of transistor Q2. Obviously, it would be highly desirable for $V_{OUT}$ to be pulled to the lower $V_{CE(sat)1}$ voltage, which is the saturation voltage of Q1, without saturating transistor Q2 and without overloading the previous stage. (Note that parasitic transistor 11 does not exist for dielectric-isolated integrated circuit structures, so the prior art circuit of FIG. 2 would work better in a dielectric-isolated structure than in a junction-isolated structure.)

If $V_{IN}$ then is rapidly decreased from a high level to a low level, Q2 and Q1 are rapidly turned off. Then all Of $I_{B1}$ flows through conductor 7 toward the base of NPN pull-up transistor Q5, but $I_{B1}$ must recharge parasitic capacitance 14 before any of $I_{B1}$ can flow into the base of pull-up transistor Q5 and turn it on. The time required to recharge parasitic capacitance 14 constitutes an undesirable delay, which may be 10 to 100 nanoseconds, in turning transistor Q5 on in response to the fast negative-going transition of $V_{IN}$.

Even if a sufficiently high power circuit stage is used to drive input conductor 2 to saturate transistor Q1, the circuit operation wherein Q2 saturates first and Q1 saturates later produces an undesirable nonlinearity in the output signal $V_{OUT}$, and also a delay in the form of a recovery time that is required for transistor Q2 to come out of saturation as it is being turned off.

Thus, it would be highly desirable to provide an improved integrated circuit output circuit stage which, when constructed in a conventional bipolar integrated circuit structure, provides a fast, highly linear response to an applied fast, negative-going input signal transition without requiring excessively large drive currents from a previous circuit stage, and also reliably provides a low output voltage level which is no more than one $V_{CE(sat)1}$ above the negative power supply voltage rail (i.e., ground in FIG. 2).

SUMMARY OF THE INVENTION

Accordingly, it is an object of the invention to provide a bipolar transistor output circuit stage which produces an output signal that swings close to negative power supply and provides a fast, linear response to an applied input signal.

It is another object of the invention to provide an output stage which, when constructed in a junction-isolated integrated circuit structure, provides fast turn-on of an NPN output pull-up transistor and also reliably produces an output voltage that is no more than one $V_{CE(sat)}$ above the negative supply voltage without requiring excessively large drive currents from a previous circuit stage.

It is another object of the invention to reduce delay due to slow recovery of a saturated output pull-down transistor of a bipolar transistor output stage.

It is another object of the invention to provide a low power, fast, linear output stage which is more stable, and therefore is more easily compensated for circuit instability, than the closest prior art.

Briefly described, and in accordance with one embodiment thereof, the invention provides a push-pull output circuit including first (Q2) and second (Q1) transistors each having a base coupled to a first conductor (2) adapted to respond to an input signal (VIN), an emitter of the first transistor (Q2) being coupled by a first resistor (RE) to a first supply voltage conductor (4), an emitter of the second transistor (Q1) being coupled to the first supply voltage conductor (4). A third transistor (Q4) includes an emitter coupled by a second conductor (5) to a collector of the first transistor (Q2), a base and collector of the third transistor (Q4) being coupled by a third conductor (7) to a base of a fourth transistor (Q5) and a first bias current source (10). An output conductor (3) is coupled to the collector of the second transistor (Q1) and an emitter of the fourth transistor (Q5), the output conductor (3) being adapted to conduct an output signal (VOUT). A fifth transistor (Q6) has an emitter, collector, and base coupled to the second conductor (5), a second supply voltage conductor (VCC), and a base and collector of a sixth transistor (Q7), respectively. An emitter of the sixth transistor (Q7) is coupled to the output conductor (3). A second bias current source (13) is coupled to a collector and base of the sixth transistor (Q7). The fifth transistor (Q6) and sixth transistor (Q7) operate to maintain the second conductor (5) and the output conductor (3) at substantially equal voltages as the output voltage is pulled toward a voltage of the first supply voltage conductor (4) by both of the first and second transistors. In the described embodiment the first through the seventh transistors all are NPN transistors. In one embodiment, the first bias current source (10) includes a PNP current mirror circuit responsive to the input signal (VIN) to increase the turn-on base current (IB1) of the fourth transistor (Q5) when the first (Q2) and second (Q1) transistors are turned off in response to a transition of the input signal (VIN). The first bias current source includes a PNP current mirror including a PNP current mirror output transistor (Q8) having an emitter coupled by a second resistor (R1) to the second supply voltage conductor (VCC) and a fourth conductor (20) coupled to an input circuit (Q10) to decrease current through the second resistor (R1) and thereby increase the turn-on base current (IB1) in response to a reduced level of the input signal (VIN) which turns the first (Q2) and second (Q1) transistor off.

BRIEF DESCRIPTION OF THE DRAWINGS

FIG. 1 is a schematic diagram of a preferred embodiment of the invention.

FIG. 2 is a schematic diagram of a prior art output circuit stage.

DETAILED DESCRIPTION OF THE PREFERRED EMBODIMENTS

Figure 3:
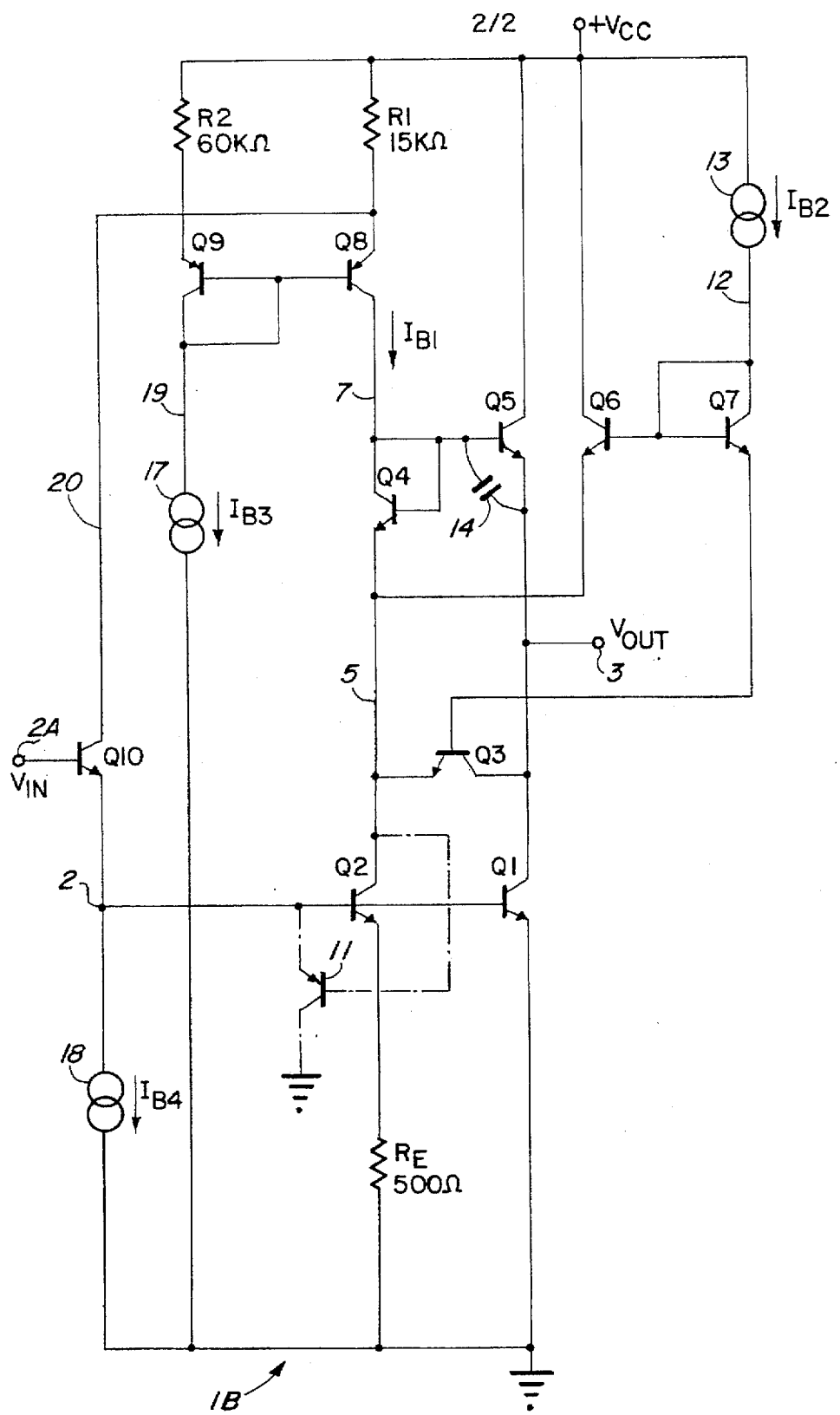
FIG. 3 is a schematic diagram of a modified version of the embodiment of FIG. 1.

Referring first to FIG. 1, push-pull output circuit stage 1 includes an input conductor 2 to which an input signal $V_{IN}$ is applied. $V_{IN}$ is produced by a previous circuit stage (not shown). Input conductor 2 is connected to the base terminals of two pull-down NPN transistors Q2 and Q1. The emitter of transistor Q2 is coupled by a resistor $R_E$, which can be 800 ohms, to ground conductor 4. Ground conductor 4 is sometimes referred to as the "negative rail"; it could be a voltage other than ground, for example, $-V_{EE}$. The collector of transistor Q2 is connected by conductor 5 to the emitter of diode-connected NPN transistor Q4 and to the emitter of NPN transistor Q6. The base and collector of transistor Q4 are connected by conductor 7 to a constant current source 10 through which a bias current $I_{B1}$ flows.

Conductor 7 also is connected to the base of NPN pull-up transistor Q5, the emitter of which is connected to output conductor 3 on which the output voltage $V_{OUT}$ is produced. (Transistors Q4 and Q5 can be considered to be a pull-up circuit for the collectors of transistors Q2 and Q1.) As in prior art FIG. 2, a large parasitic capacitance 14 (i.e., the emitter-base junction capacitance of transistor Q5) is present between the base and emitter of NPN pull-up transistor Q5.

Output conductor 3 is connected to the base and collector of diode-connected NPN transistor Q3 and to the collector of pull-down transistor Q1 and the emitter of transistor Q7. The emitter of diode-connected transistor Q3 is connected to conductor 5.

In accordance with the present invention, the bases of NPN transistors Q6 and Q7 are connected or coupled together. Q7 is a diode-connected transistor, with its base and collector connected by conductor 12 to a second bias current source 13 through which a second bias current $I_{B2}$ flows. The emitter of diode-connected transistor Q7 is connected to output conductor 3. $I_{B1}$ and $I_{B2}$ can be 30 microamperes and 4 microamperes, respectively. The designations 1×, 2×, 3×, 5× and 6× in FIG. 1 indicate exemplary relative sizes, i.e., emitter areas, of the various transistors to cause the desired circuit operation wherein transistor Q2 does not saturate substantially before transistor Q1 does.

The circuit shown in FIG. 1 has been found to be more stable than the prior art, and therefore is more easily compensated. For example, the circuit of FIG. 1 might be compensated by using a much smaller compensation capacitor. (Those skilled in the art might provide compensation capacitors between the collector and base of transistors Q1 and/or Q2.) This is a significant improvement because such large integrated circuit capacitors require a disproportionately large amounts of chip area compared to other circuit components.

The circuit of FIG. 1 differs from the prior art circuit of FIG. 2 by elimination of the feedback resistor $R_F$ and the addition of transistors Q6 and Q7 and constant bias current source 13. (Note that in the drawings, the same or similar reference numerals are used to identify corresponding components.)

FIG. 1 also differs from prior art FIG. 2 in that diode-connected transistor Q3 is completely unnecessary in the circuit of FIG. 1, but may be optionally included to prevent reverse biasing of the emitter-base junction of NPN pull-up transistor Q5 in the event that $V_{OUT}$ is inadvertently maintained at a high voltage at the same time that a large value of $V_{IN}$ is applied to transistor Q2. In that case, diode-connected transistor Q3 would prevent what would otherwise be a large reverse bias voltage being applied between the base and emitter of NPN pull-down transistor Q5, because without Q3, the base of transistor Q5 would be pulled to within approximately one $V_{BE}$ plus one $V_{CE(sat)}$ and the "IR" voltage drop across resistor RE of ground. This could cause avalanching of the emitter base junction of transistor Q5, possibly degrading its current gain or otherwise damaging it.

The operation of transistors Q2, Q1, Q4 and Q5 of FIG. 1 is the same as in prior art FIG. 2, already described. The bias current $I_{B2}$ keeps transistors Q6 and Q7 biased on, provided the relative emitter areas of the various transistors are appropriately selected as indicated above. Consequently, transistor Q6 maintains the voltage of conductor 5 at the same voltage as, or preferably at a slightly higher voltage than $V_{OUT}$, in contrast to prior art circuit 6 in which the current $I_F$ through feedback resistor $R_F$ could produce a voltage drop as large as $V_{BE3}$ (approximately 0.6 volts) between output conductor 3 and conductor 5.

This important difference, the addition of transistors Q6 and Q7 and current source 13 and the elimination of resistor $R_F$, allows the emitter area ratios of transistors Q1, Q2, Q4, Q5, Q6, and Q7 and the value of resistor $R_E$ to be selected so that transistor Q6 preferably remains on during normal operation, providing a current into conductor 5 which is summed with $I_{B1}$, producing a voltage drop across resistor $R_E$. That voltage drop and the selected device scaling establishes the desired quiescent bias current in transistor Q1. By making the emitter area of transistor Q6 larger than that of transistor Q7, the $V_{BE}$ voltage of transistor Q6 is slightly less than that for transistor Q7. Consequently, the voltage of conductor 5 is maintained slightly higher than $V_{OUT}$ as $V_{OUT}$ is pulled toward ground. This prevents transistor Q2 from saturating before transistor Q1. As transistor Q5 sources more current to the load connected to output conductor 3, its $V_{BE}$ voltage increases slightly, and the $V_{BE}$ voltage transistor Q6 decreases by a like amount. The opposite variation occurs when transistor Q1 sinks increasing amounts of current from the load.

This operation is achieved with a relatively low input current (e.g., much less than 30 microamperes) supplied by the output of the previous stage to input conductor 2. The voltage of conductor 5 therefore does not fall far enough below the value of $V_{IN}$ on conductor 2 to cause parasitic transistor 11 to turn on before transistor Q1 saturates. Therefore, parasitic transistor 11 can not rob drive current from transistor Q1 to prevent it from saturating (in a junction-isolated integrated circuit).

Furthermore, in the output circuit stage of FIG. 1 the voltages of conductor 5 are maintained at nearly the same voltage (i.e., typically no more than approximately 60 to 120 millivolts above $V_{OUT}$). Therefore, parasitic base-to-emitter parasitic capacitor 14 of transistor Q5 does not become discharged by more than approximately 60 to 120 millivolts, in contrast to the approximately 600 millivolt value by which parasitic capacitance 14 becomes discharged in prior art FIG. 2. Consequently, when $V_{IN}$ undergoes a rapid transition toward ground and turns off Q1 and Q2, bias current $I_{B1}$ does not need to recharge parasitic capacitor 14 in FIG. 1 very much as Q5 is turned on harder to supply output current to a load connected to output conductor 3. This reduces overshoot of conductor 7 and hence of output conductor 3, resulting in a more responsive circuit. This improved feedback scheme helps reduce the size of a compensation capacitor that would be required in the circuit of FIG. 1 from the size that would be required in the circuit of prior art FIG. 2, and helps eliminate some of the delay between transitions of $V_{OUT}$ and $V_{IN}$ during which parasitic capacitance 14 is recharged in the circuit of prior art FIG. 2.

Referring next to FIG. 3, push-pull output circuit stage 1B differs from the embodiment of FIG. 1 by including NPN transistor Q10, the emitter of which is connected to a constant current source circuit 18 and input conductor 2.

$V_{IN}$ is applied by conductor 2A to the base of Q10, the collector of which is connected by conductor 20 to the emitter of a PNP current mirror output transistor Q8. The emitter of transistor Q8 is connected by a resistor R1, which may be 15 kilohms, to $+V_{CC}$. The collector of PNP transistor Q8 is connected to conductor 7 and supplies the bias current $I_{BI}$. The base of transistor Q8 is connected to the base and collector of diode-connected PNP current mirror control transistor Q9, the emitter of which is connected by resistor R2, which may be 60 kilohms, to $+V_{CC}$. The collector and base of diode-connected PNP transistor Q9 are connected by conductor 19 to a constant current source 17 through which a bias current $I_{B3}$ flows.

The input transistor Q10 permits a low power circuit, such as a previous sensitive gain stage, to drive push-pull circuit 1B to produce a large current through conductor 2 into the bases of pull-down transistors Q2 and Q1 to rapidly turn them both on and saturate them at essentially the same time, without overloading previous low power circuits. $I_{B4}$, which can be 8 microamperes, plus the base current supplied to transistors Q2 and Q1 then flows through the collector of Q10, conductor 20, and resistor R1. This reduces the emitter-to-base forward bias of PNP current mirror output transistor Q8, reducing $I_{B1}$ from approximately 20 microamperes to approximately 4 microamperes. This has the desirable effect of reducing the power dissipation of push-pull output circuit 1B, making it more suitable for use in low power amplifiers.

When $V_{IN}$ is decreased to turn off Q1 and Q2, the collector current of transistor Q10 is reduced. This increases the forward bias across the emitter-base junction of PNP transistor Q8, increasing $I_{B1}$ from 4 to 20 microamperes and increasing the drive to NPN pull-up transistor Q5, allowing it to source more output current to a load connected to output conductor 3. Since PNP transistor Q8 is connected in a common base mode, good bandwidth is achieved even if transistor Q8 is a lateral PNP transistor.

It should be appreciated that the circuitry including transistors Q8 and Q9 and resistors R1 and R2 is a current controlled current source, and various other current controlled current sources could be used in place of the one shown.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A push-pull output circuit comprising in combination:
   (a) first and second transistors each having a base coupled to a first conductor coupled to respond to an input signal, an emitter of the first transistor being coupled by a first resistor to a first supply voltage conductor, an emitter of the second transistor being coupled to the first supply voltage conductor;
   (b) a third transistor having an emitter coupled by a second conductor to a collector of the first transistor, a base and collector of the third transistor being coupled by a third conductor to a base of a fourth transistor and a first bias current source;
   (c) an output conductor coupled to the collector of the second transistor and an emitter of the fourth transistor, the output conductor conducting an output signal;
   (d) a fifth transistor and a sixth transistor, the fifth transistor having an emitter, collector, and base coupled to the second conductor, a second supply voltage conductor, and a base and collector of the sixth transistor, respectively, an emitter of the sixth transistor being coupled to the output conductor; and (e) a second bias current source coupled to a collector and base of the sixth transistor, the fifth transistor and sixth transistor operating to maintain the second conductor and the output conductor at substantially equal voltages as a voltage of the output signal is pulled toward a voltage of the first supply voltage conductor by the second transistor.

2. The push-pull output circuit of claim 1 wherein the first, second, third, fourth, fifth and sixth transistors are NPN transistors.

3. The push-pull output circuit of claim 2 wherein the first bias current source is a constant bias current source.

4. The push-pull output circuit of claim 2 wherein the first bias current source includes a PNP current mirror circuit responsive to the input signal to increase the turn-on base current of the fourth transistor when the first and second transistors are turned off in response to a transition of the input signal.

5. The push-pull output circuit of claim 2 wherein the emitter area of the first transistor is scaled relative to the emitter area of the second transistor to allow a predetermined voltage drop across the first resistor plus the base-to-emitter voltage of the first transistor to develop a base-to-emitter voltage of the second transistor that establishes a predetermined bias current in the second transistor.

6. The push-pull output circuit of claim 2 wherein the second bias current source is a constant current source.

7. The push-pull output circuit of claim 4 wherein the first bias current source includes a PNP current mirror including a PNP current mirror output transistor having an emitter coupled by a second resistor to the second supply voltage conductor and a fourth conductor coupled to an input circuit to decrease current through the second resistor and thereby increase the turn-on base current in response to a level of the input signal which turns the first and second transistors off.

8. A push-pull output circuit comprising in combination:

(a) first and second transistors each having a base coupled to a first conductor coupled to respond to an input signal, an emitter of the first transistor being coupled by a first resistor to a first supply voltage conductor, an emitter of the second transistor being coupled to the first supply voltage conductor;

(b) a pull-up circuit coupled to the collectors of the first and second transistors;

(c) an output conductor coupled to the collector of the second transistor, the output conductor conducting an output signal;

(d) a third transistor and a fourth transistor, the third transistor having an emitter, collector, and base coupled to the collector of the first transistor, a second supply voltage conductor, and a base and collector of the fourth transistor, respectively, an emitter of the fourth transistor being coupled to the output conductor; and (e) a bias current source coupled to a collector and base of the fourth transistor, the third transistor and fourth transistor operating to maintain the collector of the first transistor and the output conductor at substantially equal voltages as a voltage of the output signal is pulled toward a voltage of the first supply voltage conductor by the second transistor.

9. The push-pull output circuit of claim 8 wherein the first, second, third, and fourth transistors are NPN transistors.

10. A method of operating a push-pull output circuit, comprising the steps of:

(a) applying an input signal to the bases of first and second transistors to turn them on, an emitter of the first transistor being coupled by a first resistor to a first supply voltage conductor, an emitter of the second transistor being coupled to the first supply voltage conductor, the collectors of the first and second transistors being coupled to a pull-up circuit, the collector of the second transistor being coupled to an output conductor; and (b) providing a third transistor and a diode-connected fourth transistor having a base coupled to a base of the third transistor, the third transistor having an emitter coupled to the collector of the first transistor, and applying an output signal on the output conductor to an emitter of the fourth transistor, and supplying a bias current from a current source into a second conductor coupled to the bases of the third and fourth transistors to maintain the collector voltage of the first transistor at substantially the same voltage as the output signal.

11. A push-pull output circuit comprising in combination:

(a) first and second transistors each having a control terminal coupled to a first conductor coupled to respond to an input signal, a first terminal of the first transistor being coupled by a first resistor to a first supply voltage conductor, a first terminal of the second transistor being coupled to the first supply voltage conductor;

(b) a third transistor having a first terminal coupled by a second conductor to a second terminal of the first transistor, a control terminal and second terminal of the third transistor being coupled by a third conductor to a control terminal of a fourth transistor and a first bias current source;

(c) an output conductor coupled to the second terminal of the second transistor and a first terminal of the fourth transistor, the output conductor conducting an output signal;

(d) a fifth transistor and a sixth transistor, the fifth transistor having a first terminal, second terminal, and control terminal coupled to the second conductor, a second supply voltage conductor, and a control terminal and second terminal of the sixth transistor, respectively, a first terminal of the sixth transistor being coupled to the output conductor; and (e) a second bias current source coupled to a second terminal and control terminal of the sixth transistor, the fifth transistor and sixth transistor operating to maintain the second conductor and the output conductor at substantially equal voltages as a voltage of the output signal is pulled toward a voltage of the first supply voltage conductor by the second transistor.

12. A push-pull output circuit comprising in combination:

(a) first and second transistors each having a base coupled to a first conductor coupled to respond to an input signal, an emitter of the first transistor being coupled by a first resistor to a first supply voltage conductor, an emitter of the second transistor being coupled to the first supply voltage conductor;

(b) a pull-up circuit coupled to the collectors of the first and second transistors;

(c) an output conductor coupled to the collector of the second transistor, the output conductor conducting an output signal;

(d) a unity gain amplifier circuit coupled to a second supply voltage conductor, the unity gain amplifier circuit having an input coupled to the output conductor and an output coupled to the collector of the first transistor, the unity gain amplifier operating to maintain the collector of the first transistor and the output conductor at substantially equal voltages as a voltage of the output signal is pulled toward a voltage of the first supply voltage conductor by the second transistor.

13. A push-pull output circuit comprising in combination:

(a) first and second transistors each having a control electrode coupled to a first conductor coupled to respond to an input signal, a first electrode of the first transistor being coupled by a first resistor to a first supply voltage conductor, a first electrode of the second transistor being coupled to the first supply voltage conductor;

(b) a pull-up circuit coupled to a second electrode of each of the first and second transistors;

(c) an output conductor coupled to the second electrode of the second transistor, the output conductor conducting an output signal;

(d) a unity gain amplifier circuit coupled to a second supply voltage conductor, the unity gain amplifier circuit having an input coupled to the output conductor and an output coupled to the second electrode of the first transistor, the unity gain amplifier operating to maintain the second electrode of the first transistor and the output conductor at substantially equal voltages as a voltage of the output signal is pulled toward a voltage of the first supply voltage conductor by the second transistor.

* * * * *